US010424540B2

United States Patent
Ho et al.

(10) Patent No.: US 10,424,540 B2
(45) Date of Patent: Sep. 24, 2019

(54) CHIP PACKAGE AND METHOD FOR FORMING THE SAME

(71) Applicant: XINTEC INC., Taoyuan (TW)

(72) Inventors: Yen-Shih Ho, Kaohsiung (TW); Po-Han Lee, Taipei (TW); Chia-Ming Cheng, New Taipei (TW); Hsin-Yen Lin, Taoyuan (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 15/724,058

(22) Filed: Oct. 3, 2017

(65) Prior Publication Data

US 2018/0102321 A1    Apr. 12, 2018

Related U.S. Application Data

(60) Provisional application No. 62/404,973, filed on Oct. 6, 2016.

(51) Int. Cl.
| | |
|---|---|
| *H01L 23/538* | (2006.01) |
| *H01L 23/31* | (2006.01) |
| *H01L 23/498* | (2006.01) |
| *H01L 23/00* | (2006.01) |
| *H01L 23/495* | (2006.01) |
| *H01L 27/146* | (2006.01) |

(52) U.S. Cl.
CPC ...... *H01L 23/5386* (2013.01); *H01L 23/3128* (2013.01); *H01L 23/3171* (2013.01); *H01L 23/498* (2013.01); *H01L 23/49586* (2013.01); *H01L 23/5389* (2013.01); *H01L 24/05* (2013.01); *H01L 24/13* (2013.01); *H01L 24/16* (2013.01); *H01L 27/14618* (2013.01); *H01L 27/14623* (2013.01)

(58) Field of Classification Search
CPC ......... H01L 27/14623; H01L 27/14818; H01L 31/02164; H01L 21/76883; H01L 21/76877; H01L 2221/1057; H01L 2221/1042; H01L 27/14601; H01L 27/14618; H01L 27/1462; H01L 27/14632
See application file for complete search history.

(56) References Cited

U.S. PATENT DOCUMENTS

| | | | | |
|---|---|---|---|---|
| 7,646,539 | B2 * | 1/2010 | Itoi | ............ G02B 1/105 257/432 |
| 8,164,191 | B2 * | 4/2012 | Nakamura | ........ H01L 27/14618 257/431 |

(Continued)

FOREIGN PATENT DOCUMENTS

| | | |
|---|---|---|
| TW | 201301494 | 1/2013 |
| TW | 201630152 | 8/2016 |

*Primary Examiner* — David A Zarneke
(74) *Attorney, Agent, or Firm* — Liu & Liu

(57) ABSTRACT

A chip package including a substrate having an upper surface, a lower surface, and a sidewall surface that is at the edge of the substrate is provided. The substrate includes a sensor device therein and adjacent to the upper surface thereof. The chip package further includes light-shielding layer disposed over the sidewall surface of the substrate and extends along the edge of the substrate to surround the sensor device. The chip package further includes a cover plate disposed over the upper surface of the substrate and a spacer layer disposed between the substrate and the cover plate. A method of forming the chip package is also provided.

13 Claims, 10 Drawing Sheets

(56) References Cited

U.S. PATENT DOCUMENTS

| | | | | |
|---|---|---|---|---|
| 8,536,671 B2* | 9/2013 | Liu | ...................... | H01L 23/481 |
| | | | | 257/433 |
| 8,785,956 B2* | 7/2014 | Shiu | ........................ | H01L 33/52 |
| | | | | 257/98 |
| 8,901,701 B2* | 12/2014 | Lin | .................... | H01L 21/76898 |
| | | | | 257/522 |
| 9,362,134 B2* | 6/2016 | Lin | .................... | H01L 21/76898 |
| 9,997,473 B2* | 6/2018 | Ho | ........................ | H01L 23/562 |
| 2011/0291139 A1* | 12/2011 | Chiu | ................ | H01L 27/14618 |
| | | | | 257/98 |
| 2011/0298000 A1* | 12/2011 | Liu | ...................... | H01L 23/481 |
| | | | | 257/99 |
| 2012/0097999 A1* | 4/2012 | Chiu | .................... | H01L 23/552 |
| | | | | 257/91 |
| 2013/0072615 A1* | 3/2013 | Muro | ...................... | C08L 35/02 |
| | | | | 524/406 |
| 2016/0043123 A1* | 2/2016 | Chien | ............... | H01L 27/14632 |
| | | | | 257/432 |
| 2017/0125459 A1* | 5/2017 | Tsai | .................... | H01L 27/1462 |
| 2018/0069036 A1* | 3/2018 | Kim | .................... | H01L 27/1462 |

* cited by examiner

CHIP PACKAGE AND METHOD FOR FORMING THE SAME

CROSS REFERENCE TO RELATED APPLICATIONS

This application claims the benefit of U.S. Provisional Application No. 62/404,973 filed on Oct. 6, 2016, the entirety of which is incorporated by reference herein.

BACKGROUND OF THE INVENTION

Field of the Invention

The invention relates to chip package technology, and in particular to a chip package and methods for forming the same that are capable of increasing input/output (I/O) conductive structures.

Description of the Related Art

Optoelectronic devices (e.g. an image sensing device) play an important role in capturing images and have been widely used in electronic products such as digital cameras, digital video recorders, and mobile phones. The chip packaging process is an important step in the fabrication of electronic products. Chip packages not only protect the sensing chips therein from outer environmental contaminants but also provide electrical connection paths between the electronic elements inside and those outside of the chip packages.

For sensing chip packages, optical crosstalk, is one event negatively affecting image quality thereof. When optical crosstalk is serious, images of a conventional image sensor are distorted. For example, optical crosstalk and/or petal flare problems may occur when light, incident to a non-photo-sensitive region or an adjacent image sensor device of an image sensor, is refracted onto a sensing region of an image sensor. As a result, the image quality of sensing chip packages is decreased.

Accordingly, there exists a need for a novel chip package and methods for forming the same capable of eliminating or mitigating the aforementioned problems.

BRIEF SUMMARY OF THE INVENTION

An embodiment of the invention provides a chip package that includes a substrate having an upper surface, a lower surface, and a sidewall surface that is at an edge of the substrate. The substrate includes a sensing device therein and adjacent to the upper surface of the substrate. A light-shielding layer is disposed over the sidewall surface of the substrate and extends along the edge of the substrate, so as to surround the sensing device. A cover plate is disposed over the upper surface of the substrate. A spacer layer is disposed between the substrate and the cover plate.

An embodiment of the invention provides a method for forming a chip package including providing a substrate having an upper surface and a lower surface and having a chip region and a scribe line region surrounding the chip region. The chip region of the substrate includes a sensing device therein and adjacent to the upper surface of the substrate. A spacer layer and a cover plate are formed over the upper surface of the substrate. The spacer layer is disposed between the substrate and the cover plate. A first opening is formed in the scribe line region of the substrate, so as to surround the chip region. The first opening extends from the lower surface of the substrate toward the upper surface of the substrate. A light-shielding layer is formed over a sidewall surface of the first opening. The light-shielding layer extends along the scribe line region, so as to surround the chip region.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. In addition, the present disclosure may repeat reference numbers and/or letters in the various embodiments. This repetition is for the purpose of simplicity and clarity, and does not imply any relationship between the different embodiments and/or configurations discussed. Furthermore, when a first material layer is referred to as being on or overlying a second material layer, the first material layer may be in direct contact with the second material layer, or spaced apart from the second material layer by one or more material layers.

A chip package according to an embodiment of the present invention may be used to package micro-electro-mechanical system chips. However, embodiments of the invention are not limited thereto. For example, the chip package of the embodiments of the invention may be implemented to package active or passive devices or electronic components of integrated circuits, such as digital or analog circuits. For example, the chip package is related to optoelectronic devices, micro-electro-mechanical systems (MEMS), biometric devices, micro fluidic systems, and physical sensors measuring changes to physical quantities such as heat, light, capacitance, pressure, and so on. In particular, a wafer-level package (WSP) process may optionally be used to package semiconductor chips, such as image-sensor elements, light-emitting diodes (LEDs), solar cells, RF circuits, accelerators, gyroscopes, fingerprint recognition devices, micro actuators, surface acoustic wave devices, pressure sensors, ink printer heads, and so on.

The above-mentioned wafer-level package process mainly means that after the packaging step is accomplished during the wafer stage, the wafer with chips is cut to obtain individual packages. However, in a specific embodiment, separated semiconductor chips may be redistributed on a carrier wafer and then packaged, which may also be referred to as a wafer-level package process. In addition, the above-mentioned wafer-level package process may also be adapted to form a chip package having multi-layer integrated circuit devices by a stack of a plurality of wafers having integrated circuits.

Figure 2:
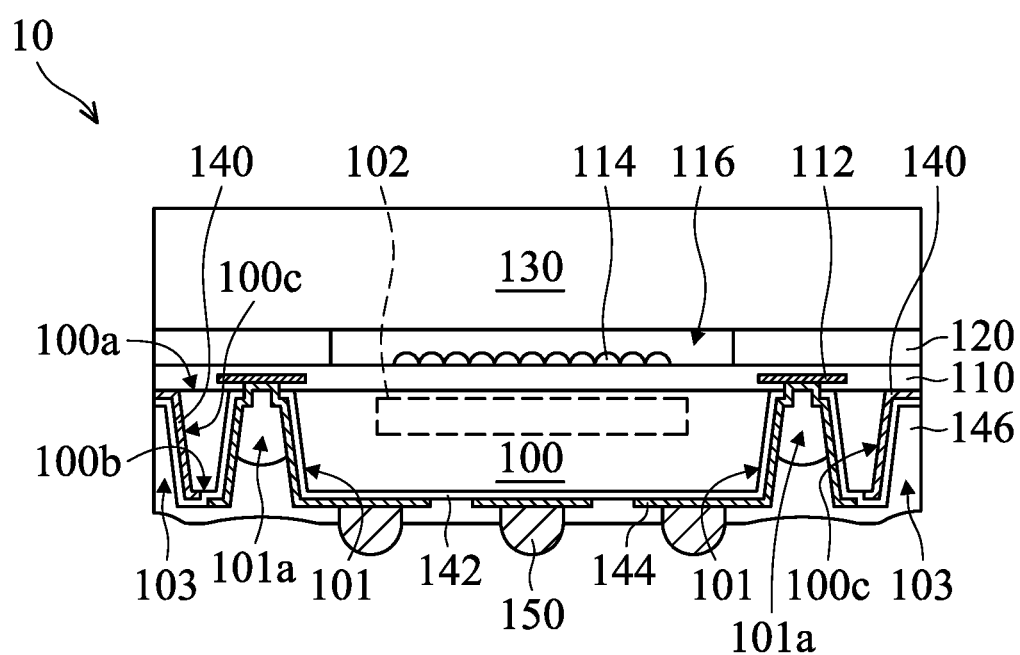
FIG. 2 is a cross-sectional view of an exemplary embodiment of a chip package according to the invention.

Refer to FIG. 2, which illustrates a cross-sectional view of an exemplary embodiment of a chip package 10 according to the invention. In the embodiment, the chip package 10 includes a substrate 100, a spacer layer 120, a cover plate 130 and a light-shielding layer 240. In one embodiment, the substrate 100 may be formed of silicon or another semiconductor material. The substrate 100 has an upper surface 100a, a lower surface 100b opposite to the upper surface 100a, and a sidewall surface 100c at the edge of the substrate 100. Moreover, the substrate 100 includes a sensing region 102 therein. The sensing region 102 may be adjacent to the upper surface 100a and include a sensing device (not shown) therein. For example, the sensing region 102 includes an image sensing device or another suitable sensing device therein. In other embodiments, the sensing region 102 may include a device that is configured to sense biometrics (e.g., a fingerprint recognition device), a device that is configured to sense environmental characteristics (e.g., a temperature-sensing element, a humidity-sensing element, a pressure-sensing element, a capacitance-sensing element), or another suitable sensing element.

An insulating layer 110 is disposed on the substrate 100. In one embodiment, a chip/die is comprised of the insulating layer 110 and the substrate 100. Moreover, the insulating layer 110 may be formed of an interlayer dielectric (ILD) layer, an inter-metal dielectric (IMD) layer, a passivation layer or a combination thereof. To simplify the diagram, only a single insulating layer 110 is depicted herein. In some embodiments, the insulating layer 110 may comprise an inorganic material, such as silicon oxide, silicon nitride, silicon oxynitride, metal oxide, or a combination thereof, or another suitable insulating material.

In the embodiment, the insulating layer 110 includes one or more conductive pads 112 therein and is adjacent to the upper surface 100a. In one embodiment, the conductive pad 122 may be formed of a single conductive layer or multiple conductive layers. To simplify the diagram, only few conductive pads 112 comprising a single conductive layer are depicted herein as an example. In the embodiment, the insulating layer 110 has openings therein to expose corresponding conductive pads 112. In one embodiment, the sensing device in the sensing region 102 is electrically connected to the conductive pad 122 via interconnect structures (not shown) in the substrate 100 and the insulating layer 110.

Figure 7:
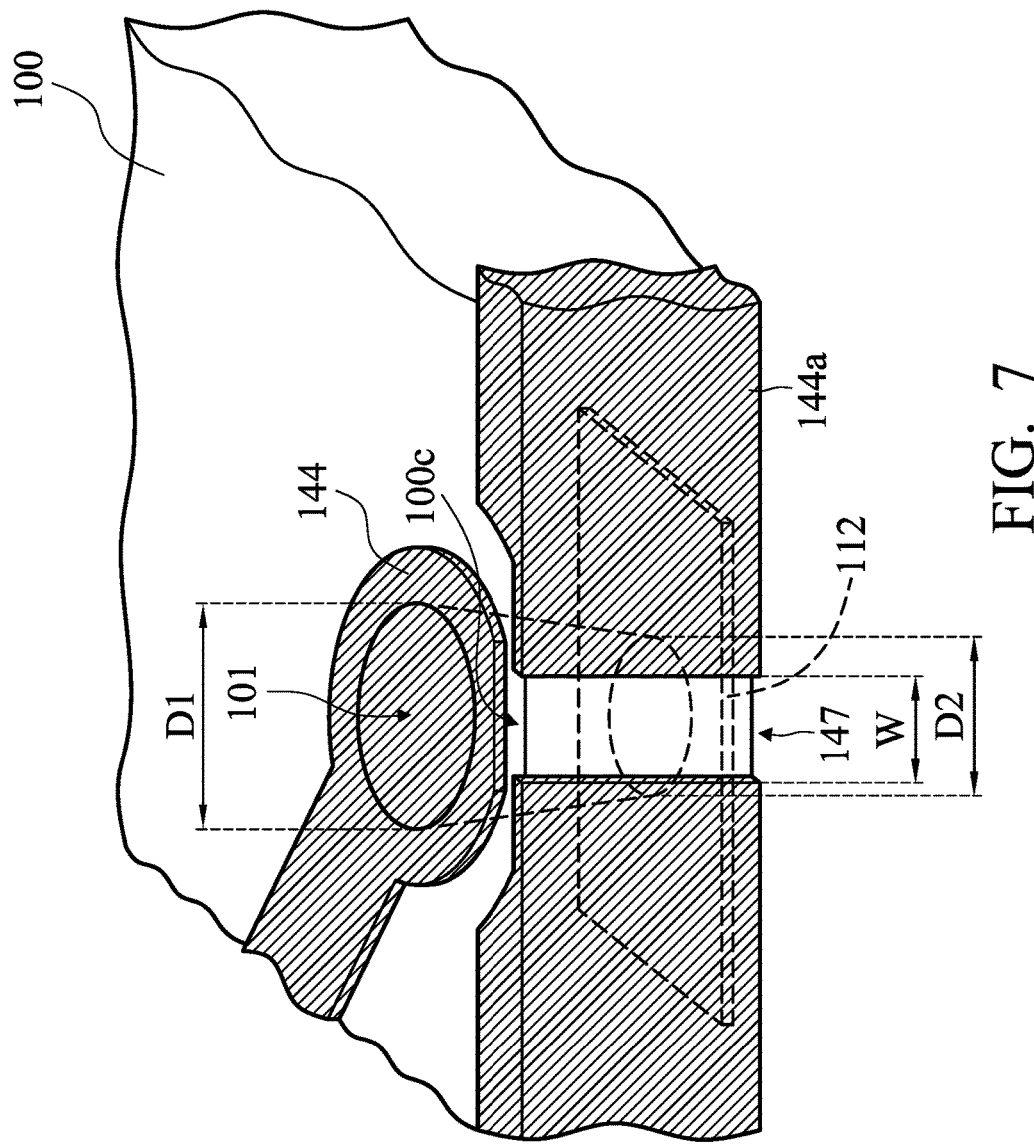
FIG. 7 is a partial perspective diagram showing a flipped through substrate via and a flipped light-shielding layer which are formed in the chip package shown in FIG. 6.

In the embodiment, a first opening 103 extends from the lower surface 100b of the substrate 100 to the upper surface 100a of the substrate 100, so that the first opening 103 passes through the substrate 100 and exposes the insulating layer 110. Moreover, the first opening 103 extends along the edges of the substrate 100 to surround the sensing region 102. In this case, the first opening 103 has an inclined sidewall: That is, the chip has inclined edge sidewalls. In the embodiment, one or more second openings 101 extend from the lower surface 100b of the substrate 100 to the upper surface 100a of the substrate 100, so that the second openings 101 pass through the substrate 100 and correspond to the openings in the insulating layer 110 so as to expose the corresponding conductive pads 112. In one embodiment, a first diameter D1 (as indicated in FIG. 7) of the second openings 101 adjacent to the lower surface 100a (i.e., the lower width of the second openings 101) is greater than a second diameter D2 (as indicated in FIG. 7) of the second openings 101 adjacent to the upper surface 100a (i.e., the upper width of the second openings 101). As a result, the second openings 101 have inclined sidewalls.

The top-view profile of the second openings 101 may be different from that of the first opening 103. For example, the top-view profile of the second openings 101 is circular while the top-view profile of the first opening 103 is ring-shaped, such as rectangular ring-shaped. It should be realized that the top-view profiles of the second openings 101 and the first opening 103 may be another shape, and they are not limited thereto.

In the embodiments, the chip package 10 further includes an optical element 114 disposed on the insulating layer 110 and corresponding to the sensing region 102. In one embodiment, the optical element 114 may comprise a microlens array, a color filter, or a combination thereof or another suitable optical element.

In the embodiments, the chip package 10 further includes a cover plate 130 disposed over the upper surface 100a of the substrate 100 so as to protect the optical element 114. In one embodiment, the cover plate 130 may comprise glass, quartz, transparent polymer or another suitable transparent material. Moreover, in the embodiments, the chip package 10 further includes a spacer layer (or referred to as dam) 120 disposed between the substrate 100 and the cover plate 130. The spacer layer 120 covers the conductive pads 112 and exposes the optical element 114. In the embodiment, the cover plate 130, the spacer layer 120, and the insulating layer 110 together surround a cavity 116 on the sensing region 102 so that the optical element 114 is located in the cavity 116. In other embodiments, the spacer layer 120 covers the optical element 114 so that there is no cavity between the cover plate 130 and the insulating layer 110.

In one embodiment, the spacer layer 120 does not substantially absorb moisture and may be non-adhesive. In this case, the cover plate 130 is attached on the insulating layer 110 on the substrate 100 through an additional adhesive layer. In some other embodiments, the spacer layer 120 may itself be adhesive. In those cases, the cover plate 130 can attach to the insulating layer 110 on the substrate 100 by the spacer layer 120. As a result, the spacer layer 120 may contact none of the adhesion glue, thereby assuring that the spacer layer 120 will not move due to the disposition of the adhesion glue. Furthermore, since the adhesion glue is not needed, the optical element 114 can be prevented from being contaminated by an overflow of adhesion glue.

In one embodiment, the spacer layer 120 may comprise epoxy resin, inorganic materials (such as silicon oxide, silicon nitride, silicon oxynitride, metal oxide or a combination thereof), organic polymer materials (such as polyimide (polyimide), butylcyclobutene (BCB), parylene, polynaphthalenes, fluorocarbons, or acrylates), a photoresist material or another suitable insulating material.

In the embodiment, the light-shielding layer 140 is conformally disposed on the sidewall surface 100c of the substrate 100 (i.e., the sidewall of the first opening 103) and contacts the substrate 100. The light-shielding layer 140 extends along the edge of the substrate 100, so as to surround the sensing device in the sensing region 102. In one embodiment, the light-shielding layer 140 may also extend onto the lower surface 100b of the substrate 100 and the bottom of the first openings 103. In one embodiment, the light-shielding layer 140 may be formed of a metal material. For example, the metal material comprises aluminum, titanium, tungsten, copper, or a combination thereof.

In the embodiment, the chip package 10 further includes an insulating liner 142 disposed on the lower surface 100b of the substrate 100 and conformally extending to the sidewalls and bottoms of the first opening 103 and the second openings 101, so that the insulating liner 142 extends onto the sidewall surface 100c of the substrate 100 to cover the light-shielding layer 140. Moreover, the insulating liner 142 in the second opening 101 has an opening exposing the conductive pad 122. In one embodiment, the insulating liner 142 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates), or another suitable insulating material.

In the embodiment, the chip package 10 further includes a patterned redistribution layer 144 disposed on the insulating liner 142 over the lower surface 100b of the substrate 100, so that the insulating liner 142 is between the redistribution layer 144 and the substrate 100. Moreover, the redistribution layer 144 conformally extends to the sidewall and the bottom of the second openings 101 and does not extend into the first opening 103. The redistribution layer 144 is electrically isolated from the substrate 100 via the insulating liner 142 and is in direct electrical contact with or indirectly electrically connected to the exposed conductive pads 112 through the second openings 101. Therefore, the redistribution layer 144 in the second openings 101 is also referred to as a through silicon via (TSV). In other embodiments, the redistribution layer 144 can also electrically connected to the corresponding conducting pads 122 using the T-contact method. In one embodiment, the redistribution layer 144 may comprise aluminum, titanium, tungsten, copper, or a combination thereof.

In the embodiment, the chip package 10 further includes a passivation layer 146 disposed on the lower surface 100b of the substrate 100, and fills the second openings 101 and the first opening 103 to cover the redistribution layer 144 and the light-shielding layer 140. In the embodiment, the passivation layer 146 has an uneven surface. For example, the surface of the passivation layer 146 has recess portions corresponding to the second openings 101 and the first opening 103. In one embodiment, the passivation layer 146 may comprise epoxy resin, solder mask, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates), or another suitable insulating material.

In the embodiment, the second openings 101 are not fully filled with the passivation layer 146, so that a hole 101a is formed between the redistribution layer 144 and the passivation layer 146 within the second openings 101. Therefore, the hole 101a can be a buffer between the redistribution layer 144 and the passivation layer 146 in thermal cycles induced in subsequent processes. Unwanted stress, which is induced between the redistribution layer 144 and the passivation layer 146 as a result of mismatch of thermal expansion coefficients, is reduced. The redistribution layer 144 is prevented from being excessively pulled by the passivation layer 146 when external temperature or pressure dramatically changes. As a result, problems such as peeling or disconnection of the redistribution layer 144, which is close to the conducting pad structure, are avoidable. In one embodiment, the interface between the passivation layer 146 and the hole 101a has an arcuate contour.

The passivation layer 146 on the lower surface 100b of the substrate 100 has openings exposing portions of the redistribution layer 144. Moreover, a plurality of conductive structures 150 (such as solder balls, bumps or conductive pillars) is electrically connected to the exposed redistribution layer 144 through the openings of the passivation layer 146. In one embodiment, the conductive structures 150 may comprise tin, lead, copper, gold, nickel, or a combination thereof.

Figure 4:
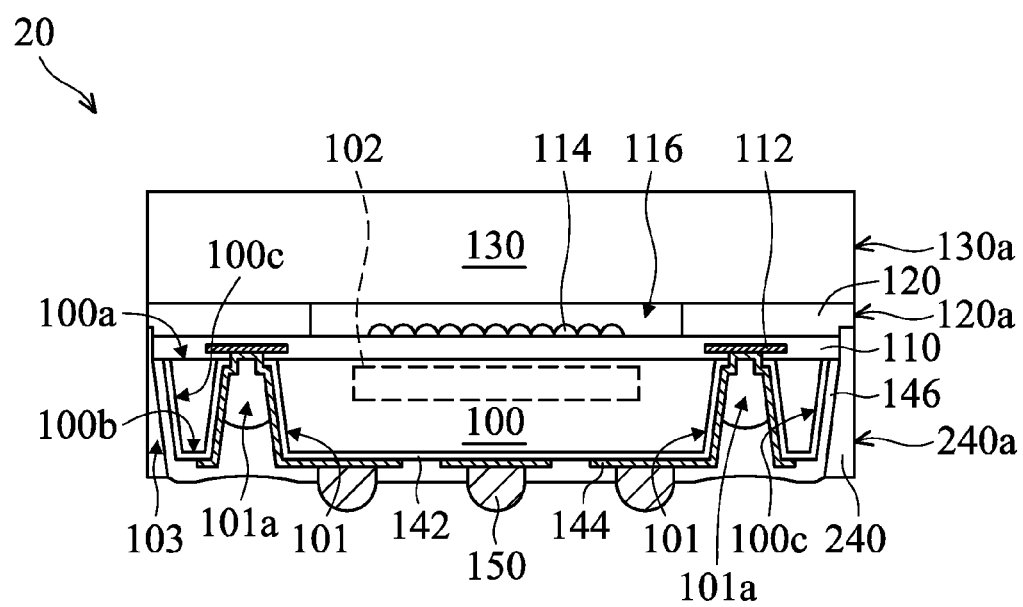
FIG. 4 is a cross-sectional view of another exemplary embodiment of a chip package according to the invention.

Refer to FIG. 4, which is a cross-sectional view of another exemplary embodiment of a chip package 20 according to the invention. Elements in FIG. 4 that are the same as those in FIG. 2 are labeled with the same reference numbers as in FIG. 2 and are not described again for brevity. In the embodiment, the structure of the chip package 20 is similar to that of the chip package 10 shown in FIG. 2. The difference is a light-shielding layer 240 in the chip package 20 covers the passivation layer 146 and entirely fills the first opening 103. In this case, the light-shielding layer 240 has a sidewall surface 240a that is substantially level with a sidewall surface 120a of the spacer layer 120 and a sidewall surface 130a of the cover plate 130. In one embodiment, the light-shielding layer 240 is comprised of a black insulating material which can block and/or absorb light (e.g., infrared light) from outside. For example, the light-shielding layer 240 may comprise a photoresist material, a polyimide material or another suitable material.

Figure 6:
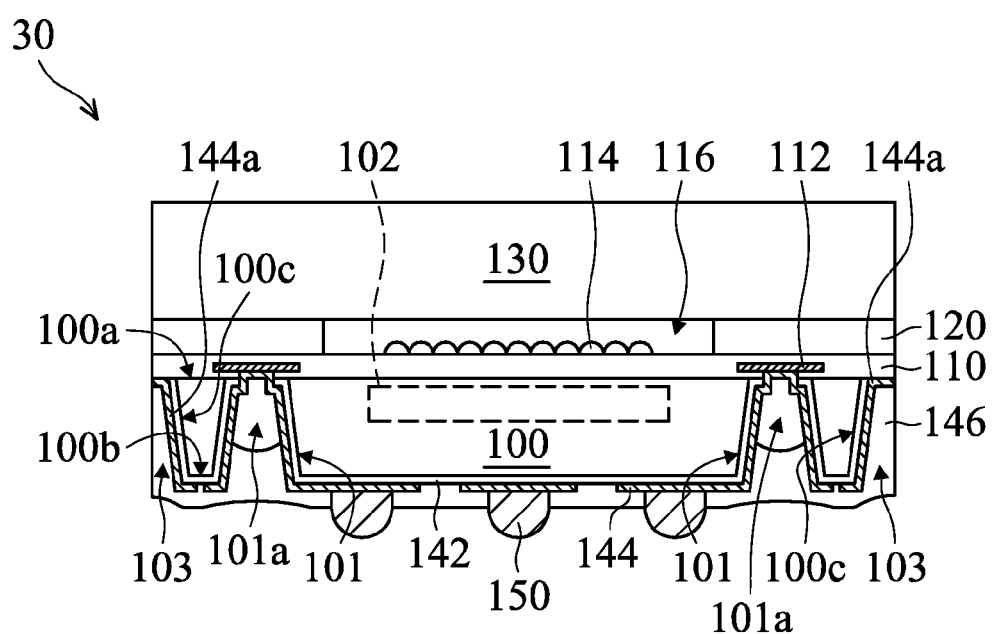
FIG. 6 is a cross-sectional view of yet another exemplary embodiment of a chip package according to the invention.

Refer to FIG. 6, which is a cross-sectional view of yet another exemplary embodiment of a chip package 30 according to the invention. Elements in FIG. 6 that are the same as those in FIG. 2 are labeled with the same reference numbers as in FIG. 2 and are not described again for brevity. In the embodiment, the structure of the chip package 30 is similar to that of the chip package 10 shown in FIG. 2. The difference is that a light-shielding layer 144a in the chip package 30 and the redistribution layer 144 are formed of and defined by the same metal layer. The insulating liner 142 extends onto the sidewall surface 100c of the substrate 100, so that the insulating liner 142 is between the light-shielding layer 144a and the substrate 100. In this case, the light-shielding layer 144a and the redistribution layer 144 on the insulating liner 142 are separated from each other. In one embodiment, the metal layer for definition of the light-shielding layer 144a and the redistribution layer 144 may comprise aluminum, titanium, tungsten, cooper, or a combination thereof.

Refer to FIG. 7, which is a partial perspective diagram showing a flipped through substrate via (i.e., the redistribution layer 144 in the second openings 101) and a flipped light-shielding layer 144a which are formed in the chip package 30 shown in FIG. 6. In one embodiment, the light-shielding layer 144a has a slit corresponding to the through substrate via in each of the second openings 101. In order to simplify the diagram, only a through substrate via and a corresponding slit 147 are depicted. The slit 147 extends along an extending direction of the depth of the second openings 101 (i.e., a direction from the lower surface 100b of the substrate 100 toward the upper surface 100a of the substrate 100), so as to disconnect the light-shielding layer 144a. In one embodiment, the slit 147 has a width W that is less than or equal to the second diameter D2 of the second openings 101 (i.e., the upper width of the second openings 101). It should be realized that the light-shielding layer 140 of the chip package 10 in FIG. 2 and the light-shielding layer 240 of the chip package 20 in FIG. 4 may also respectively have a slit that is the same as or similar to the slit 147.

In the embodiments mentioned above, the chip packages 10, 20 and 30 all comprise front side illumination (FSI) sensing devices. However, in other embodiments, the chip packages 10, 20 and 30 may comprise back side illumination (BSI) sensing devices.

Figure 1A:
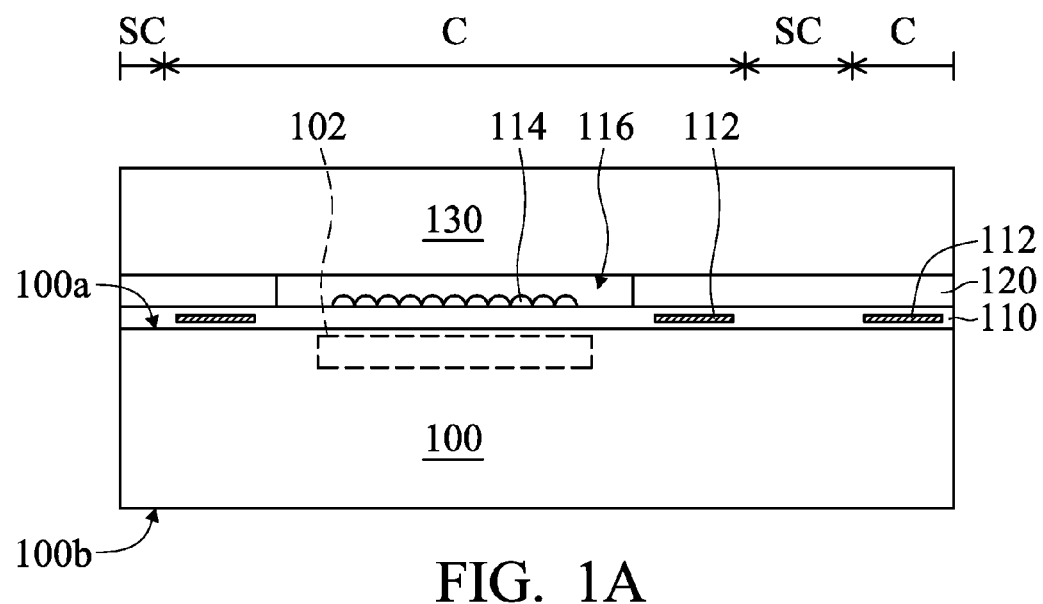
FIGS. 1A to 1F are cross-sectional views of an exemplary embodiment of a method for forming a chip package according to the invention.

FIGS. 1A to 1F are cross-sectional views of an exemplary embodiment of a method for forming a chip package according to the invention. Elements in FIGS. 1A to 1G that are the same as those in FIG. 2 are labeled with the same reference numbers as in FIG. 2 and are not described again for brevity. Refer to FIG. 1A, a substrate 100 is provided. The substrate 100 has an upper surface 100a and a lower surface 100b opposite thereto. The substrate 100 may include a plurality of chip regions and a scribe line region that surrounds the plurality of chip regions and separates the adjacent chip regions from each other. To simplify the diagram, only a complete chip region C, an incomplete chip region C adjacent thereto, and a scribe line region SC separating these chip regions C are depicted herein. In one embodiment, the substrate 100 may be a silicon wafer so as to facilitate the wafer-level packaging process. In another embodiment, the substrate 100 may be a silicon substrate or another semiconductor substrate.

In the embodiment, chip regions C of the substrate 100 include a sensing region 102 and the sensing region 102 may be adjacent to the upper surface 100a of the substrate 100. Moreover, the sensing region 102 may include a sensing device (not shown) therein. In the embodiment, an insulating layer 110 is disposed on the substrate 100. The insulating layer 110 may be made of an ILD layer, IMD layer, a passivation layer or a combination thereof. To simplify the diagram, only a flat layer is depicted herein. In one embodiment, the insulating layer 110 may comprise an inorganic material, such as silicon oxide, silicon nitride, silicon oxynitride, metal oxide, or a combination thereof, or another suitable insulating material. Moreover, the insulating layer 110 includes one or more conductive pads 112 therein. The conductive pads 112 correspond to the chip regions C of the substrate 100 and are adjacent to the upper surface 100a of the substrate 100. In one embodiment, the conductive pad 122 may be formed of a single conductive layer or multiple conductive layers. To simplify the diagram, only few conductive pads 112 comprising a single conductive layer are depicted herein as an example. In one embodiment, the sensing device in the sensing region 102 is electrically connected to the conductive pad 122 via interconnect structures (not shown) in the substrate 100 and the insulating layer 110.

In the embodiment, the aforementioned structure may be fabricated by sequentially performing a front-end process (for example, the sensing region 102 is formed in the substrate 100) and a back-end process (for example, the insulating layer 110, the interconnection structures, and the conductive pads 112 are formed on the substrate 100) of a semiconductor device. In other words, the following method for forming a chip package includes subsequent packaging processes performed on the substrate after the back-end process is finished.

In the embodiment, the chip region C includes an optical element 114 disposed over the upper surface 100a of the substrate 100 and corresponding to the sensing region 102.

In the embodiment, the optical element 114 may comprise a microlens array, a color filter, or a combination thereof or another suitable optical element.

Afterward, a cover plate 130 is provided. In the embodiment, the cover plate 130 may comprise glass, quartz, transparent polymer or another suitable transparent material. Afterwards, a spacer layer 120 is formed on the cover plate 130. The cover plate 130 is bonded onto the insulating layer 110 on the upper surface 100a of the substrate 100 via the spacer layer 220. A cavity 116 is formed between the cover plate 130 and the substrate 100 in the chip region C via the spacer layer 120 surrounding the sensing region 102 of the substrate 100, so that the optical element 114 is located in the cavity 116 and the optical element 114 in the cavity 116 is protected by the cover plate 130.

In some embodiments, the spacer layer 120 may be formed on the insulating layer 110 over the substrate 100, and then bond the cover plate 130 to the substrate 100. In other embodiments, the spacer layer 120 may cover the optical element 114 so that there is no cavity between the substrate 100 and the cover plate 130.

In one embodiment, the spacer layer 120 can be formed by a deposition process (such as a coating process, a physical vapor deposition process, a chemical vapor deposition process or another suitable process). Moreover, the spacer layer 120 may comprise epoxy resin, inorganic materials (such as silicon oxide, silicon nitride, silicon oxynitride, metal oxide or a combination thereof), organic polymer materials (such as polyimide, butylcyclobutene (BCB), parylene, polynaphthalenes, fluorocarbons or acrylates), or another suitable insulating material. Alternatively, the spacer layer 120 may comprise a photoresist material, and may be patterned by a lithography process to form the cavity 116.

Figure 1B:
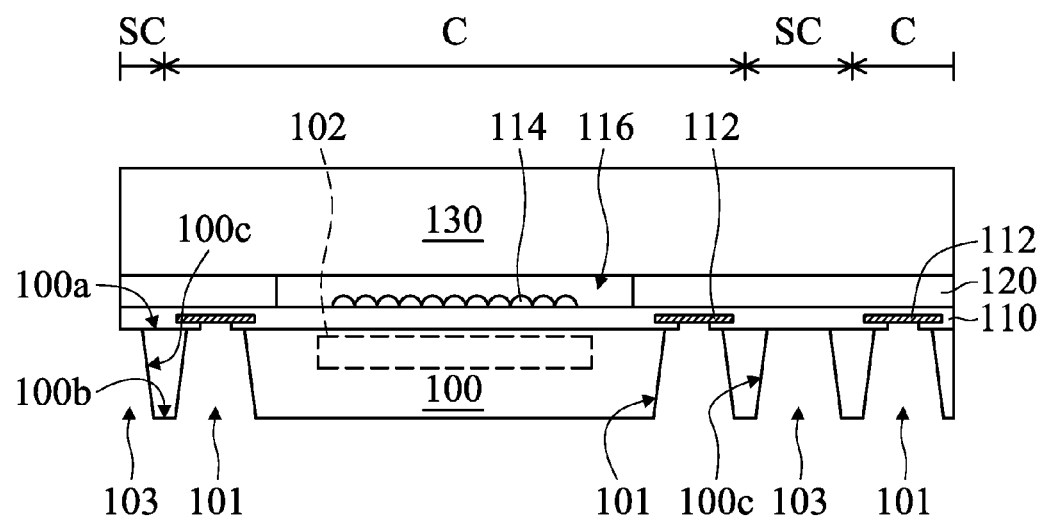

Refer to FIG. 1B, a thinning process (such as an etching process, a milling process, a grinding process or a polishing process) is performed on the lower surface 100b of the substrate 100 by using the cover plate 130 as a carrier substrate, to reduce the thickness of the substrate 100. Afterwards, a first opening 103 and second openings 101 may be simultaneously formed in the substrate 100 in each of the chip regions C by a lithography process and an etching process (such as a dry etching process, a wet etching process, a plasma etching process, a reactive ion etching process, or another suitable process). The second openings 101 and the first opening 103 extend from the lower surface 100b toward the upper surface 100a to pass through the substrate 100 and respectively expose the conductive pads 112 and the insulating layer 110. In one embodiment, the first opening 103 and the second openings 101 are formed by a lithography process and an etching process.

In the embodiment, the first opening 103 extends along the scribe line region SC between the adjacent chip regions C to surround the chip region C and pass through the substrate 100, so that the substrate 100 in each of the chip regions C are separated from each other. The first opening 103 has inclined sidewalls, so that the substrate 100 in each of the chip regions C has an inclined sidewall surface 100c.

In the embodiment, the second openings 101 correspond to the conductive pads 112 and a first diameter D1 (as indicated in FIG. 7) of the second openings 101 adjacent to the lower surface 100a (i.e., the lower width of the second openings 101) is greater than a second diameter D2 (as indicated in FIG. 7) of the second openings 101 adjacent to the upper surface 100a (i.e., the upper width of the second openings 101). Therefore, the second openings 101 have inclined sidewalls. The inclined sidewalls contribute to reduce the difficulty of the process for subsequently forming layers (e.g., insulating layer and redistribution layer) in the second openings 101, and reliability of the chip package is improved. For example, since the second diameter D2 of the second openings 101 adjacent to the upper surface 100a of the substrate 100 is less than the first diameter D1 of the openings 103 adjacent to the lower surface 100b, layers subsequently formed in the second openings 101 can be easily deposited on corners of the second openings 101 to prevent these layers on the corners from fracturing.

In one embodiment, these second openings 101 in the chip region C may be arranged apart along the first opening 103. The second openings 101 and the first opening 103 are spaced apart from each other by a portion (such as a sidewall portion) of the substrate 100.

In other embodiments, a portion of the second openings 101 adjacent to the lower surface 100b and a portion of the first opening 101 adjacent to the lower surface 100b may be in communication with each other, so that the substrate 100 has a sidewall portion that is lower than the lower surface 100b. Namely, the thickness of the sidewall portion is less than the thickness of the substrate 100. In those cases, it is possible to avoid a buildup of stress in the substrate 100 between the second openings 101 and the first opening 103. Stress can be mitigated and released through the first opening 103, thereby preventing the sidewall portions of the substrate 100 from being cracked.

In the embodiment, the first opening 103 may extend along the scribe line region SC (i.e., the edge of the chip region C) and surround the second openings 101 and the sensing region 102 in the substrate 100. Moreover, the top-view profile of the second openings 101 may be different from that of the first opening 103. For example, the top-view profile of the second openings 101 is circular while the top-view profile of the first opening 103 is ring-shaped, such as rectangular ring-shaped. It should be realized that the top-view profiles of the second openings 101 and the first opening 103 may be another shape, and they are not limited thereto.

Figure 1C:
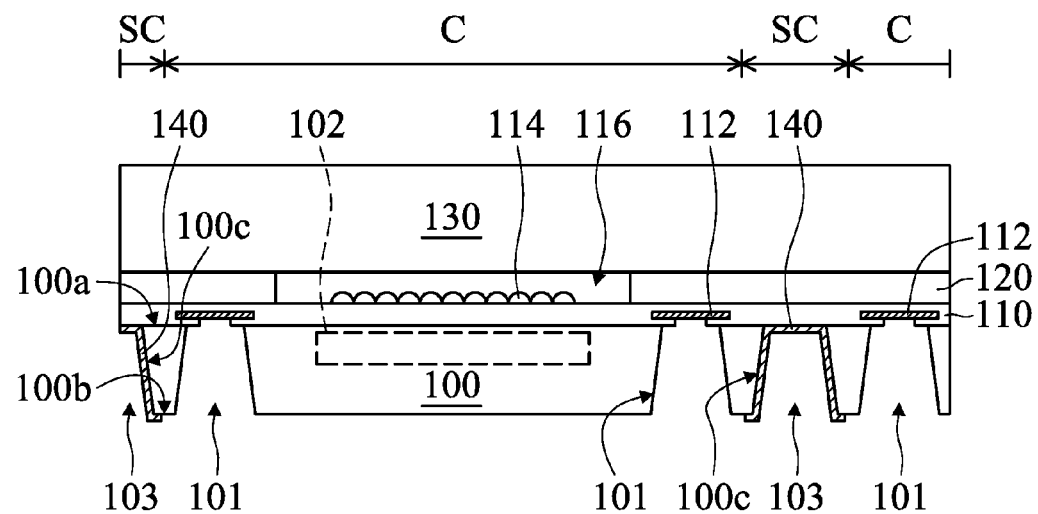

Refer to FIG. 1C, a light-shielding layer 140 may be formed in the first opening 103 of the substrate 100 and the lower surface 100b of the substrate 100 adjacent to the first opening 103 by a deposition process (such as a coating process, a physical vapor deposition process, a chemical vapor deposition process or another suitable process), so as to contact the substrate 100. The light-shielding layer 140 is conformally deposited on the sidewall surface of the first opening 103 (i.e., the sidewall surface 100c of the substrate 100) and the bottom surface of the first opening 103. The light-shielding layer 140 on the sidewall surface 100c of the substrate 100 surrounds the chip region C of the substrate 100. In one embodiment, the light-shielding layer 140 comprises a metal material. For example, the metal material comprises aluminum, titanium, tungsten, copper, or a combination thereof.

Figure 1D:
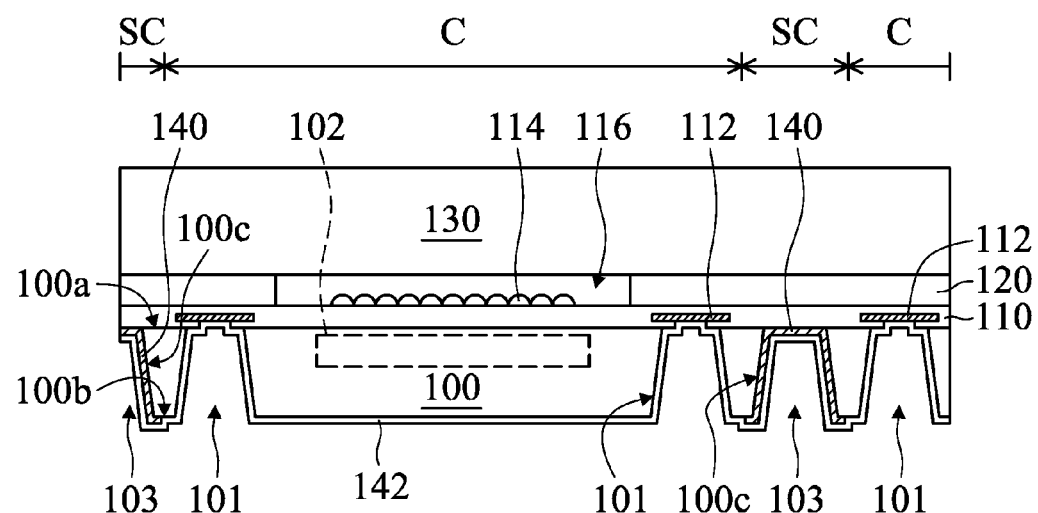

Refer to FIG. 1D, an insulating liner 142 is formed on the lower surface 100b of the substrate 100 by a deposition process (such as a coating process, a physical vapor deposition process, a chemical vapor deposition process or another suitable process). The insulating liner 142 is conformally deposited to the sidewall surfaces and the bottom surfaces of the second openings 101 and the first opening 103, so that the insulating liner 142 extends onto the sidewall surface 100c of the substrate 100 to cover the light-shielding layer 140. In one embodiment, the insulating liner 142 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or another suitable insulating material.

Figure 1E:
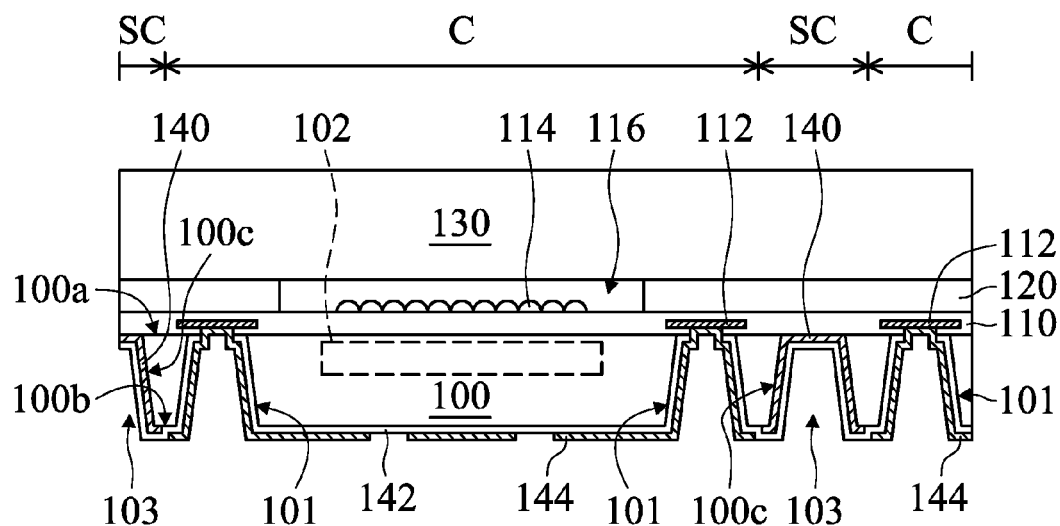

Refer to FIG. 1E, the insulating liner 142 on the bottom of the second openings 101 and the underlying insulating layer 110 are removed so as to expose the conductive pads 112 at the bottom of the second openings 101. Afterwards, a patterned redistribution layer 144 is formed on the insulating liner 142 by a deposition process (such as a coating process, a physical vapor deposition process, a chemical vapor deposition process, a plating process, an electroless plating process or another suitable process), a lithography process, and an etching process. In the embodiment, the redistribution layer 144 is formed on the lower surface 100b of the substrate 100, conformally extends onto the sidewall surfaces and bottom surfaces of the second openings 101 and does not extend into the first opening 103. The redistribution layer 144 is electrically isolated from the substrate 100 via the insulating liner 142 and is in direct electrical contact with or indirectly electrically connected to the exposed conductive pads 112 through the second openings 101. Therefore, the redistribution layer 144 in the second openings 101 is also referred to as a through silicon via (TSV). In one embodiment, the redistribution layer 144 may comprise aluminum, titanium, tungsten, copper, or a combination thereof or another suitable conductive material.

Figure 1F:
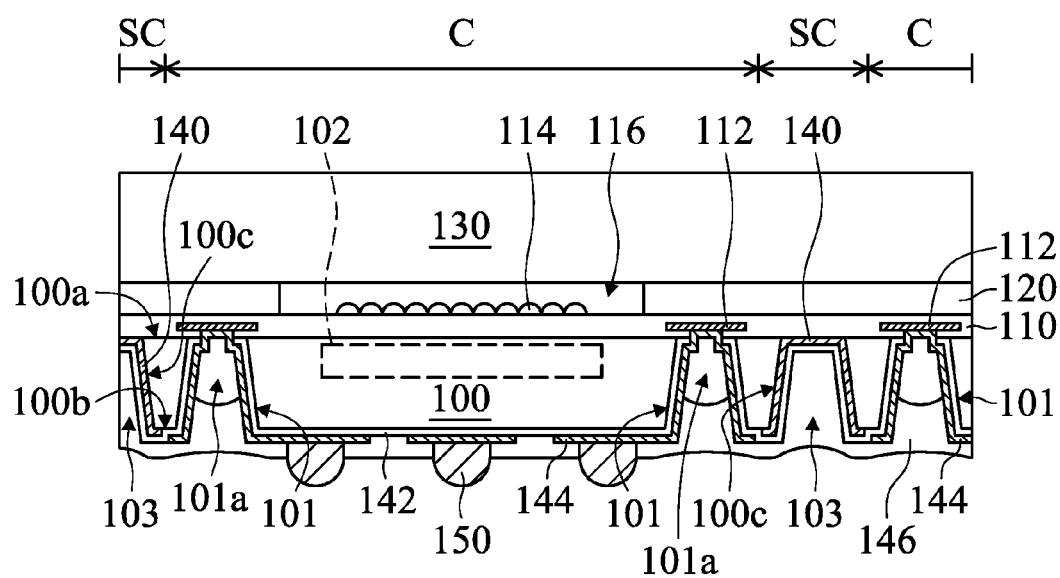

Refer to FIG. 1F, a passivation layer 146 may be formed over the lower surface 100b of the substrate 100 and filled in the second openings 101 and the first opening 103 by a deposition process, so as to cover the redistribution layer 144 and the light-shielding layer 140. In one embodiment, the passivation layer 146 may comprise epoxy resin, solder mask, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates), or another suitable insulating material.

In the embodiment, the passivation layer 146 entirely fills the first opening 103 and partially fills the second openings 101, so that a hole 101a is formed between the redistribution layer 144 and the passivation layer 146 in each second opening 101. In one embodiment, the interface between the hole 101a and the passivation layer 146 has an arcuate contour. In other embodiments, the passivation layer 146 may entirely fill the second openings 101.

Afterwards, openings are formed in the passivation layer 146 on the lower surface 100b of the substrate 100 by a lithography process and an etching process to expose portions of the redistribution layer 144.

Subsequently, a plurality of conductive structures 150 (such as solder balls, bumps or conductive pillars) may be filled in the openings of the passivation layer 146 by a plating process, a screen printing process or another suitable process to electrically connect to the exposed redistribution layer 144. In one embodiment, the conductive structures 150 may comprise tin, lead, copper, gold, nickel or a combination thereof.

The passivation layer 146, the light-shielding layer 140, the insulating layer 110, the spacer layer 120, and the cover plate 130 at the scribe line region SC are successively diced along a direction from the lower surface 100b of the substrate 100 toward the cover plate 130, thereby separating the passivation layer 146, the light-shielding layer 140, the insulating layer 110, the spacer layer 120, and the cover plate 130 in each of the chip regions C. For example, a dicing saw or laser may be used to perform the dicing process. After performing the dicing process, individual chip packages 10 are formed, as shown in FIG. 2.

It should be realized that although the embodiments of FIGS. 1A to 1F provide a method for forming a chip package with an FSI sensing device, the method for forming the external electrical connection paths of the chip (such as the opening in the substrate, the redistribution layer, the protection layer, or the conductive structures therein) can be implemented to the processes of a BSI sensing device.

Figure 3A:
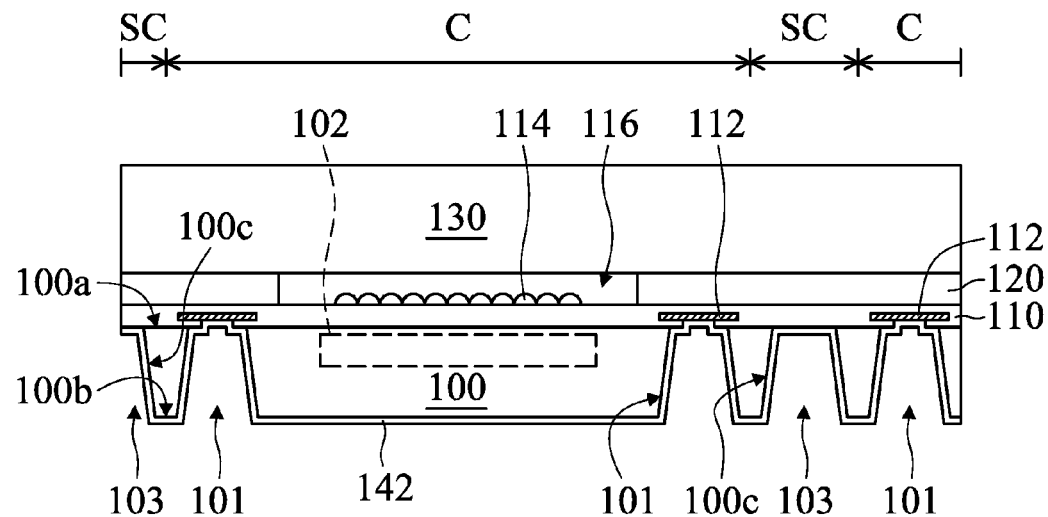
FIGS. 3A to 3E are cross-sectional views of another exemplary embodiment of a method for forming a chip package according to the invention.

FIGS. 3A to 3E are cross-sectional views of another exemplary embodiment of a method for forming a chip package according to the invention. Elements in FIGS. 3A to 3E that are the same as those in FIGS. 1A to 1F are labeled with the same reference numbers as in FIGS. 1A to 1F and are not described again for brevity. Refer to FIG. 3A, a structure as shown in FIG. 1B is provided. Afterwards, an insulating liner 142 is formed on the lower surface 100b of the substrate 100. The insulating liner 142 is conformally deposited to the sidewall surfaces and the bottom surfaces of the second openings 101 and the first opening 103.

Figure 3B:
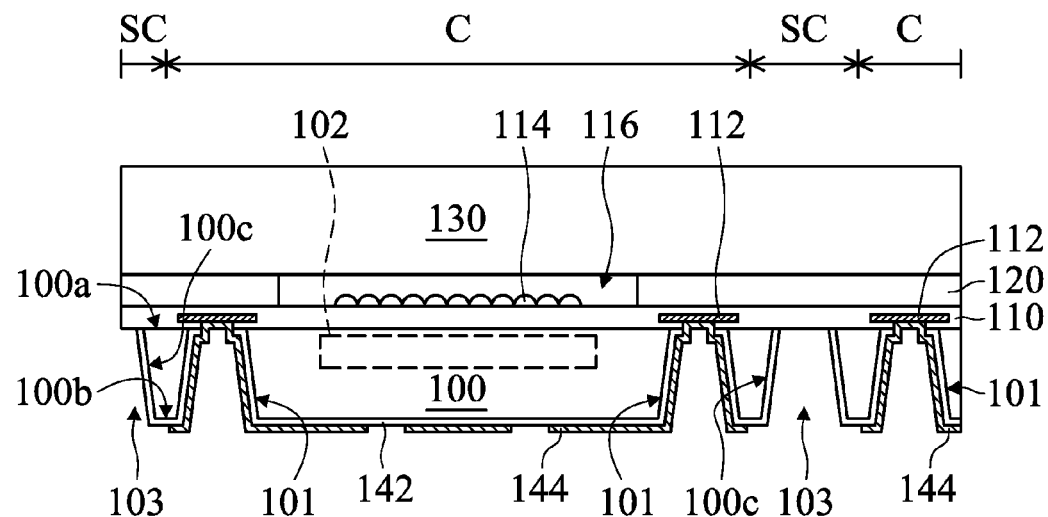

Refer to FIG. 3B, the insulating liner 142 on the bottom of the first opening 103, on the bottom of the second openings 101, and the insulating layer 110 under the bottom of the second openings 101 are removed so as to expose the conductive pads 112 at the bottom of the second openings 101. Afterwards, a patterned redistribution layer 144 is formed on the insulating liner 142. In the embodiment, the redistribution layer 144 is formed on the lower surface 100b of the substrate 100, conformally extends onto the sidewall surfaces and bottom surfaces of the second openings 101 and does not extend into the first opening 103. The redistribution layer 144 extending into the second openings 101 is electrically connected to the exposed conductive pads 112.

Figure 3C:
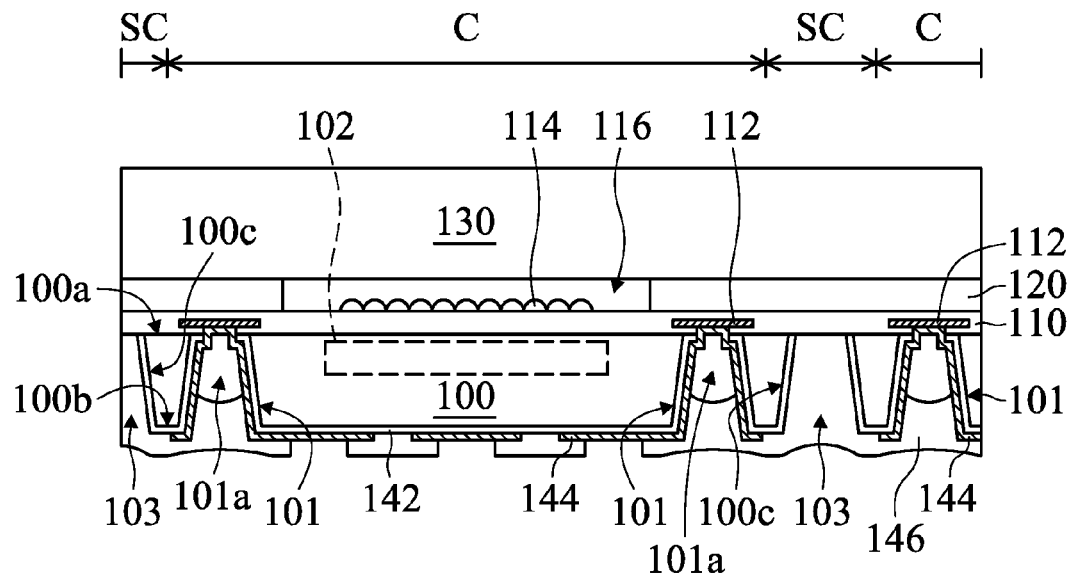

Refer to FIG. 3C, a passivation layer 146 is formed over the lower surface 100b of the substrate 100 and filled in the second openings 101 and the first opening 103, so as to cover the redistribution layer 144. In the embodiment, the passivation layer 146 entirely fills the first opening 103 and partially fills the second openings 101, so that a hole 101a is formed between the redistribution layer 144 and the passivation layer 146 in each second opening 101. In one embodiment, the interface between the hole 101a and the passivation layer 146 has an arcuate contour. In other embodiments, the passivation layer 146 may entirely fill the second openings 101. Afterwards, openings are formed in the passivation layer 146 on the lower surface 100b of the substrate 100 to expose portions of the redistribution layer 144.

Figure 3D:
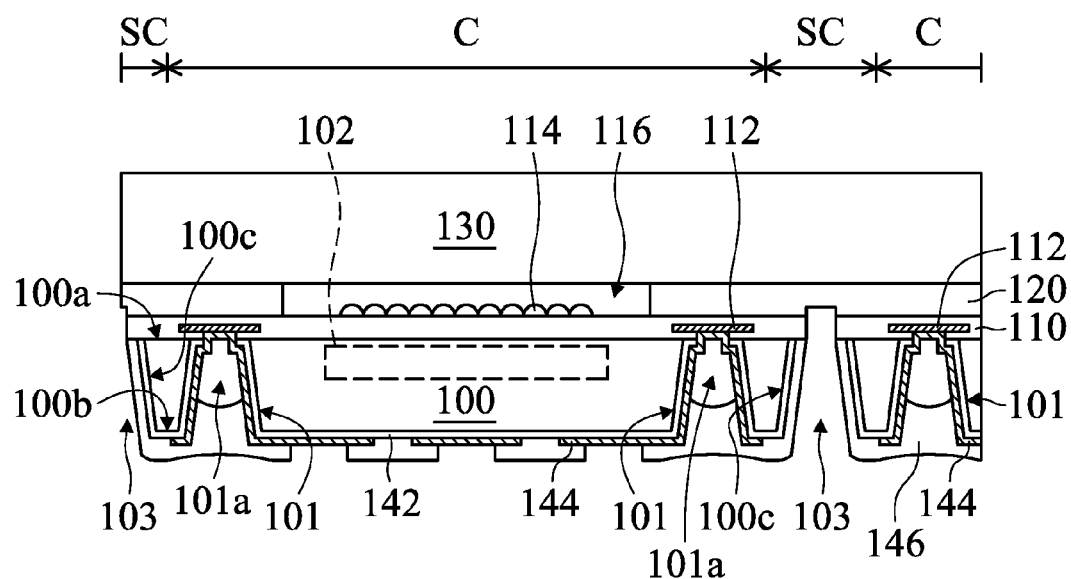

Refer to FIG. 3D, a portion of the passivation layer 146 in the first opening 103 is removed by a lithography process and an etching process, such that the remained passivation layer 146 conformally covers the sidewall surface of the first opening 103 and the insulating layer 110 is exposed. In one embodiment, when the passivation layer 146 in the first opening 103 is removed, the exposed insulating layer 110 and a portion of the spacer layer 120 above the exposed insulating layer 110 may further removed, so that the first opening 130 further extends into the spacer layer 120.

Figure 3E:
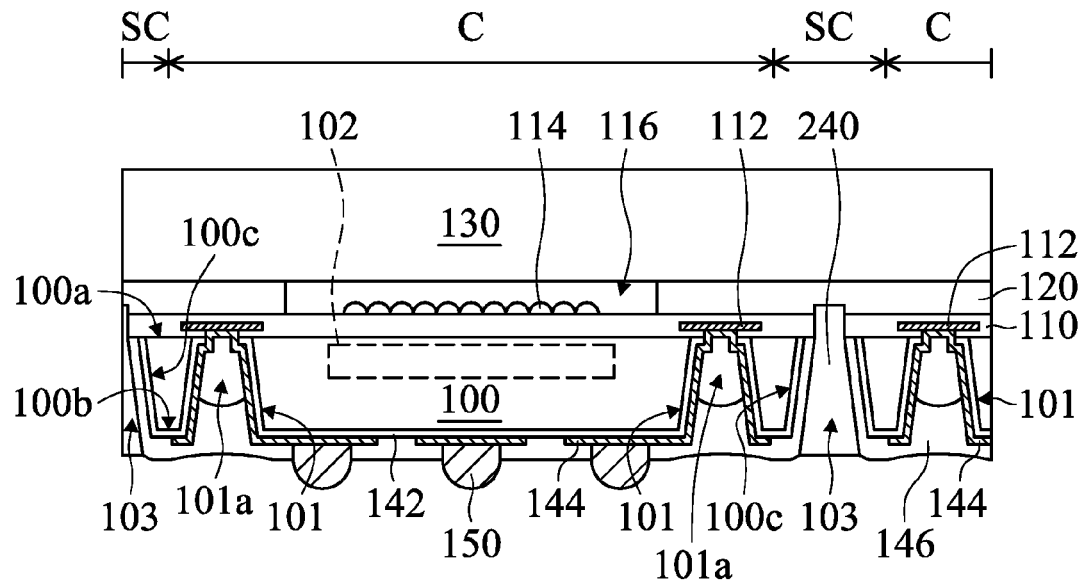

Refer to FIG. 3E, a light-shielding layer 240 is formed in the first opening 103 of the scribe line region SC, so as to cover the passivation layer 146 on the sidewall surface of the first opening 103. In one embodiment, the light-shielding layer 240 is comprised of a black insulating material which can block and/or absorb light (e.g., infrared light) from outside. For example, the light-shielding layer 240 may comprise a photoresist material, a polyimide material or another suitable material.

Subsequently, a plurality of conductive structures 150 (such as solder balls, bumps or conductive pillars) may be filled in the openings of the passivation layer 146 to electrically connect to the exposed redistribution layer 144.

The light-shielding layer 240, the spacer layer 120, and the cover plate 130 at the scribe line region SC are successively diced along a direction from the lower surface 100b of the substrate 100 toward the cover plate 130, thereby separating the light-shielding layer 240, the spacer layer 120, and the cover plate 130 in each of the chip regions C. After performing the dicing process, the light-shielding layer 240 has a sidewall surface 240a that is substantially level with a sidewall surface 120a of the spacer layer 120 and a sidewall surface 130a of the cover plate 130 and individual chip packages 20 are formed, as shown in FIG. 4.

It should be realized that although the embodiments of FIGS. 3A to 3E provide a method for forming a chip package with an FSI sensing device, the method for forming the external electrical connection paths of the chip (such as the opening in the substrate, the redistribution layer, the protection layer, or the conductive structures therein) can be implemented to the processes of a BSI sensing device.

Figure 5A:
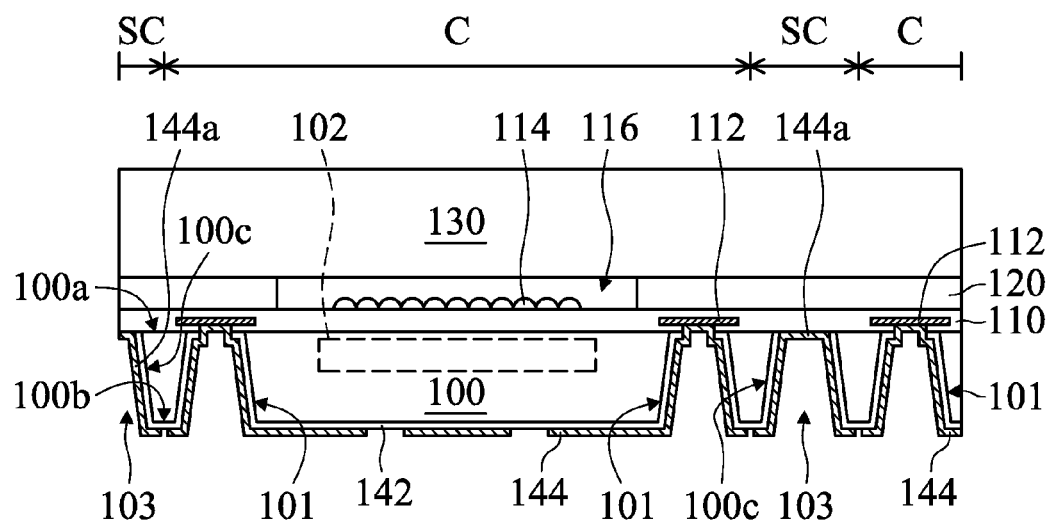
FIGS. 5A to 5B are cross-sectional views of yet another exemplary embodiment of a method for forming a chip package according to the invention.
Figure 5B:
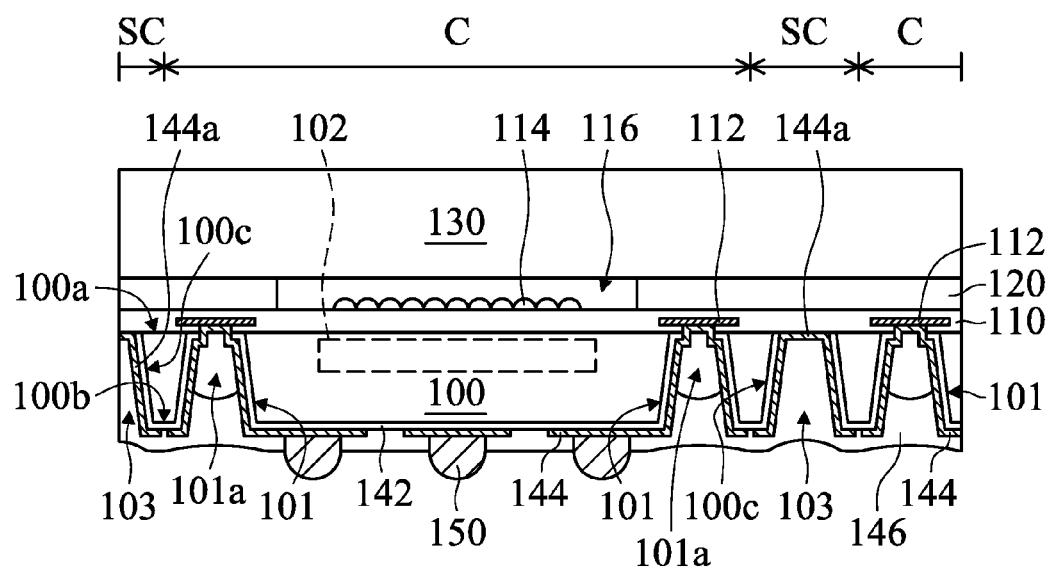

FIGS. 5A to 5B are cross-sectional views of yet another exemplary embodiment of a method for forming a chip package according to the invention. Elements in FIGS. 5A to 5B that are the same as those in FIGS. 1A to 1F and 3A to 3E are labeled with the same reference numbers as in FIGS. 1A to 1F and 3A to 3E and are not described again for brevity. Refer to FIG. 5A, a structure as shown in FIG. 3A is provided. Afterwards, the insulating liner 142 on the bottom of the first opening 103, on the bottom of the second openings 101, and the insulating layer 110 under the bottom of the second openings 101 are removed so as to expose the conductive pads 112 at the bottom of the second openings 101.

Afterwards, a metal layer (not shown) is deposited on the insulating layer 110. In the embodiment, the metal layer is formed over the lower surface 100b of the substrate 100 and conformally formed on the sidewall surfaces and the bottom surfaces of the second openings 101 and the first opening 103. In one embodiment, the metal layer may comprise aluminum, titanium, tungsten, copper, or a combination thereof. Next, a redistribution layer 144 and a light-shielding layer 144a are simultaneously formed by patterning the metal layer. In the embodiment, the redistribution layer 144 is formed over the lower surface 100b of the substrate 100, conformally extends onto the sidewall surfaces and bottom surfaces of the second openings 101 and does not extend into the first opening 103. The redistribution layer 144 extending into the second openings 101 is electrically connected to the exposed conductive pads 112. Moreover, the light-shielding layer 144a is conformally formed on the sidewall surface and the bottom surface of the first opening 103, extends onto the lower surface 100b of the substrate 100, and is separated from the redistribution layer 144.

In one embodiment, the light-shielding layer 144a has a slit corresponding to the through substrate via in each of the second openings 101. Refer to FIG. 7, which illustrates a through substrate via and a corresponding slit 147. The slit 147 extends along an extending direction of the depth of the second openings 101 (i.e., a direction from the lower surface 100b of the substrate 100 toward the upper surface 100a of the substrate 100), so as to disconnect the light-shielding layer 144a. In one embodiment, the slit 147 has a width W that is less than or equal to the second diameter D2 of the second openings 101 (i.e., the upper width of the second openings 101). It should be realized that the light-shielding layer 140 of the chip package 10 in FIG. 2 and the light-shielding layer 240 of the chip package 20 in FIG. 4 may also respectively have a slit that is the same as or similar to the slit 147.

Refer to FIG. 5B, a passivation layer 146 is formed over the lower surface 100b of the substrate 100 and filled in the second openings 101 and the first opening 103, so as to cover the redistribution layer 144 and the light-shielding layer 144a, respectively. In the embodiment, the passivation layer 146 entirely fills the first opening 103 and partially fills the second openings 101, so that a hole 101a is formed between the redistribution layer 144 and the passivation layer 146 in each second opening 101. In one embodiment, the interface between the hole 101a and the passivation layer 146 has an arcuate contour. In other embodiments, the passivation layer 146 may entirely fill the second openings 101. Afterwards, openings are formed in the passivation layer 146 on the lower surface 100b of the substrate 100 to expose portions of the redistribution layer 144.

Subsequently, a plurality of conductive structures 150 (such as solder balls, bumps or conductive pillars) may be filled in the openings of the passivation layer 146 to electrically connect to the exposed redistribution layer 144.

The passivation layer 146, the light-shielding layer 144a, the insulating layer 110, the spacer layer 120, and the cover plate 130 at the scribe line region SC are successively diced along a direction from the lower surface 100b of the substrate 100 toward the cover plate 130, thereby separating the passivation layer 146, the light-shielding layer 144a, the insulating layer 110, the spacer layer 120, and the cover plate 130 in each of the chip regions C. For example, a dicing saw or laser may be used to perform the dicing process. After performing the dicing process, individual chip packages 30 are formed, as shown in FIG. 6.

It should be realized that although the embodiments of FIGS. 5A to 5B provide a method for forming a chip package with an FSI sensing device, the method for forming the external electrical connection paths of the chip (such as the opening in the substrate, the redistribution layer, the protection layer, or the conductive structures therein) can be implemented to the processes of a BSI sensing device.

According to the aforementioned embodiments of the invention, since the light-shielding layer covers the sidewall surface of the substrate and extends along the edge of the chip region to surround the sensing device, it is capable of blocking and/or absorbing light (e.g., infrared light) from passing through the substrate of the sensing chip, so as to prevent the sensing region in the substrate from being impacted. As a result, optical crosstalk problems can be eliminated or mitigated, so as to improve or maintain image quality of sensing chip packages.

Moreover, the light-shielding layer and the redistribution layer can be formed of and defined by the same metal layer, and therefore there is not necessary to perform an additional process or increase the manufacture cost. In such a case, the light-shielding layer may have a slit corresponding to the through substrate via, so as to ensure that the light-shielding layer is not connected to the redistribution layer, thereby maintaining the normal operation of the chip packages.

While the invention has been disclosed in terms of the preferred embodiments, it is not limited. The various embodiments may be modified and combined by those skilled in the art without departing from the concept and scope of the invention.

What is claimed is:

1. A chip package, comprising:
   a substrate having an upper surface, a lower surface, and a sidewall surface that is at an edge of the substrate, wherein the substrate comprises a sensing device therein and adjacent to the upper surface of the substrate;
   an insulating layer disposed on the substrate and extending to cover over entire region of sensing device, wherein an optical element is disposed on the insulating layer;
   a light-shielding layer disposed over the sidewall surface of the substrate and extending along the edge of the substrate, so as to surround the sensing device, wherein the light-shielding layer has a slit along the sidewall surface of the substrate;
   a cover plate disposed over the upper surface of the substrate; and
   a spacer layer disposed between the substrate and the cover plate.

2. The chip package as claimed in claim 1, wherein the substrate further comprises a plurality of openings that extends from the lower surface of the substrate toward the upper surface of the substrate, and wherein a first diameter of the plurality of openings adjacent to the lower surface of the substrate is greater than a second diameter of the plurality of openings adjacent to the upper surface of the substrate.

3. The chip package as claimed in claim 2, wherein the light-shielding layer has the slit corresponding to each of the plurality of openings, and wherein the slit extends along an extending direction of the depth of the plurality of openings, so as to disconnect the light-shielding layer, and has a width that is less than or equal to the second diameter.

4. The chip package as claimed in claim 2, further comprising:
   a redistribution layer disposed over the lower surface of the substrate and extending into the plurality of openings; and
   an insulating liner disposed between the redistribution layer and the substrate.

5. The chip package as claimed in claim 4, wherein the light-shielding layer and the redistribution layer is formed of and defined by the same metal layer, and wherein the insulating liner extends onto the sidewall surface of the substrate, so that the insulating liner is between the light-shielding layer and the substrate.

6. The chip package as claimed in claim 5, wherein the metal layer comprises aluminum, titanium, tungsten, copper, or a combination thereof.

7. The chip package as claimed in claim 4, wherein the light-shielding layer comprises a metal material, and wherein the insulating liner extends onto the sidewall surface of the substrate and covers the light-shielding layer.

8. The chip package as claimed in claim 7, wherein the metal material comprises aluminum, titanium, tungsten, copper, or a combination thereof.

9. The chip package as claimed in claim 4, further comprising:
   a passivation layer covering the redistribution layer and the light-shielding layer and filling the plurality of openings; and
   a conductive structure passing through the passivation layer to electrically connect the redistribution layer.

10. The chip package as claimed in claim 4, further comprising:

a passivation layer covering the redistribution layer and filling the plurality of openings; and a conductive structure passing through the passivation layer to electrically connect the redistribution layer.

11. The chip package as claimed in claim 10, wherein the light-shielding layer has a sidewall surface level with that of the spacer layer and that of the cover plate.

12. The chip package as claimed in claim 10, wherein the light-shielding layer comprises a black insulating material.

13. A chip package, comprising:
   a substrate having an upper surface, a lower surface, and a sidewall surface that is at an edge of the substrate, wherein the substrate comprises a sensing device therein and adjacent to the upper surface of the substrate, wherein the substrate further comprises a plurality of openings that extends from the lower surface of the substrate toward the upper surface of the substrate;
   a light-shielding layer disposed over the sidewall surface of the substrate and extending along the edge of the substrate, so as to surround the sensing device, wherein the light-shielding layer has a slit along the sidewall surface of the substrate;
   a cover plate disposed over the upper surface of the substrate;
   a spacer layer disposed between the substrate and the cover plate;
   a redistribution layer disposed over the lower surface of the substrate and extending into the plurality of openings;
   a passivation layer covering the redistribution layer and partially filling the plurality of openings, wherein a plurality of holes are defined between the redistribution layer and the passivation layer in the plurality of openings.

* * * * *